(12) United States Patent
Ren et al.

(10) Patent No.: US 10,606,138 B2
(45) Date of Patent: Mar. 31, 2020

(54) DISPLAY SUBSTRATE REPAIRING METHOD AND SYSTEM, DISPLAY SUBSTRATE AND DISPLAY PANEL

(71) Applicants: BOE TECHNOLOGY GROUP CO., LTD., Beijing (CN); HEFEI XINSHENG OPTOELECTRONICS TECHNOLOGY CO., LTD., Anhui (CN)

(72) Inventors: Xingfeng Ren, Beijing (CN); Yaoyao Feng, Beijing (CN); Yongjiu Cheng, Beijing (CN)

(73) Assignees: BOE TECHNOLOGY GROUP CO., LTD., Beijing (CN); HEFEI XINSHENG OPTOELECTRONICS TECHNOLOGY CO., LTD., Hefei, Anhui (CN)

( * ) Notice: Subject to any disclaimer, the term of this patent is extended or adjusted under 35 U.S.C. 154(b) by 18 days.

(21) Appl. No.: 15/977,084

(22) Filed: May 11, 2018

(65) Prior Publication Data
US 2019/0004382 A1 Jan. 3, 2019

(30) Foreign Application Priority Data
Jul. 3, 2017 (CN) .......................... 2017 1 0534133

(51) Int. Cl.
*G02F 1/1362* (2006.01)
*H01L 27/32* (2006.01)
(Continued)

(52) U.S. Cl.
CPC ...... *G02F 1/136259* (2013.01); *G02F 1/1303* (2013.01); *G02F 1/133345* (2013.01);
(Continued)

(58) Field of Classification Search
CPC ............ G02F 1/136259; G02F 1/1303; G02F 1/133345; G02F 1/1368;
(Continued)

(56) References Cited

U.S. PATENT DOCUMENTS

| 2005/0110736 A1* | 5/2005 | Jinno | ................... G09G 3/3208 345/92 |
| 2016/0126259 A1 | 5/2016 | Namin et al. | |
| 2018/0108687 A1* | 4/2018 | Zhao | ................. G02F 1/136259 |

FOREIGN PATENT DOCUMENTS

| CN | 101178489 A | 5/2008 |
| CN | 101592797 A | 12/2009 |

(Continued)

OTHER PUBLICATIONS

First Office Action for Chinese Application No. 201710534133.0, dated Jul. 2, 2019, 10 Pages.

*Primary Examiner* — Yosef Gebreyesus
(74) *Attorney, Agent, or Firm* — Brooks Kushman P.C.

(57) ABSTRACT

A display substrate repairing method, a display substrate repairing system, a display substrate and a display panel are provided. The display substrate repairing method includes: forming, in the case that a signal line of the display substrate is detected to be open-circuited or short-circuited, a repair line at a disconnected portion of the signal line being open-circuited or a disconnected portion of the signal line formed during a short circuit repairing process; forming a protective layer at least in an area where the repair line is located.

10 Claims, 3 Drawing Sheets

(51) Int. Cl.
  *H01L 51/56*    (2006.01)
  *G02F 1/13*     (2006.01)
  *G02F 1/1333*   (2006.01)
  *G02F 1/1368*   (2006.01)

(52) U.S. Cl.
  CPC ...... *H01L 27/3258* (2013.01); *H01L 27/3276* (2013.01); *H01L 51/56* (2013.01); *G02F 1/1368* (2013.01); *G02F 2001/136263* (2013.01); *G02F 2201/50* (2013.01); *H01L 2251/568* (2013.01)

(58) Field of Classification Search
  CPC ..... G02F 2001/136263; G02F 2201/50; H01L 27/3258; H01L 27/3276; H01L 2251/568
  See application file for complete search history.

(56) References Cited

FOREIGN PATENT DOCUMENTS

| | | |
|---|---|---|
| CN | 104280967 A | 1/2015 |
| CN | 105785678 A | 7/2016 |
| CN | 105892115 A | 8/2016 |
| KR | 20080037388 A | 4/2008 |
| WO | 2013040798 A1 | 3/2013 |

\* cited by examiner

DISPLAY SUBSTRATE REPAIRING METHOD AND SYSTEM, DISPLAY SUBSTRATE AND DISPLAY PANEL

CROSS-REFERENCE TO RELATED APPLICATION

This application claims priority to Chinese Patent Application No. 201710534133.0 filed on Jul. 3, 2017, which is incorporated herein by reference in its entirety.

TECHNICAL FIELD

The present disclosure relates to a field of display technology, and in particular to a display substrate repairing method, a display substrate repairing system, a display substrate and a display panel.

BACKGROUND

During a manufacturing process of a display substrate, a product yield thereof may be reduced significantly due to an open circuit defect and a short circuit defect, so a repair of the signal line is very important for improving the product yield.

During the repairing process, for the open circuit defect, a conductive film may be deposited at a disconnected portion of the signal line, so as to repair the disconnected portion; for the short circuit defect, the conductive particles causing the short circuiting of the signal lines may be removed through a laser, meanwhile the signal line may be disconnected at the short circuiting portion by the laser, so it is required to deposit a conductive film at the disconnected portion to from a repair line for repairing the disconnected portion.

However, after the repairing process, the subsequent cleaning, coating, and other operations may adversely affect the repair line and even make it to fall off, resulting in failure of the repairing. Therefore, the signal repairing in the related art has a poor repair effect on signal lines and adversely affects the product quality.

SUMMARY

A display substrate repairing method, including: forming, in the case that a signal line of the display substrate is detected to be open-circuited or short-circuited, a repair line at a disconnected portion of the signal line being open-circuited or a disconnected portion of the signal line formed during a short circuit repairing process; forming a protective layer at least in an area where the repair line is located.

Optionally, the forming, in the case that the signal line of the display substrate is detected to be open-circuited or short-circuited, the repair line at the disconnected portion of the signal line being open-circuited or the disconnected portion of the signal line formed during the short circuit repairing process, further includes: removing a film layer above the disconnected portion of the signal line to form a groove; forming the repair line in the groove; where the forming the protective layer at least in the area where the repair line is located further includes: filling a material of the protective layer into the groove where the repair line is located, until the groove is full of the material of the protective layer.

Optionally, the protective layer is opaque.

Optionally, the forming the protective layer at least in the area where the repair line is located further includes: forming the protective layer in a part of an area of a pixel unit provided with the repair line.

Optionally, the protective layer is insulated.

Optionally, the material of the protective layer includes an organic material.

Optionally, the forming, in the case that the signal line of the display substrate is detected to be open-circuited or short-circuited, the repair line at the disconnected portion of the signal line being open-circuited or the disconnected portion of the signal line formed during the short circuit repairing process, further includes: forming the repair line through a laser chemical vapor deposition process or an ink-jet printing process.

Optionally, the forming the protective layer at least in the area where the repair line is located further includes: coating a material of the protective layer at least onto the area where the repair line is located, through an ink-jet printing process; curing the material of the protective layer, to form the protective layer.

Optionally, the forming the protective layer at least in the area where the repair line is located further includes: forming the protective layer in an overall area of a pixel unit provided with the repair line.

A display substrate is further provided in the present disclosure, including a signal line having a disconnected portion formed during an open circuit repairing process or a short circuit repairing process, where a repair line is arranged at the disconnected portion of the signal line, and a protective layer is arranged at least in an area where the repair line is located.

Optionally, the signal line is a source electrode signal line, and the display substrate further includes an organic film layer, a conductive layer and an insulation layer stacked on the signal line; a groove penetrating through the organic film layer, the conductive layer and the insulation layer is arranged at the disconnected portion of the signal line; the repair line is arranged in the groove full of the protective layer being opaque.

Optionally, the signal line is a source electrode signal line, and the display substrate further includes an organic film layer and an insulation layer stacked on the signal line; a groove penetrating through the organic film layer and the insulation layer is arranged at the disconnected portion of the signal line; the repair line is arranged in the groove full of the protective layer being opaque and insulated; the display substrate further includes a light-emitting layer and a cathode layer stacked on the protective layer and the organic film layer.

Optionally, the protective layer covers the repair line and being in direct contact with a sidewall of the groove; an upper surface of the protective layer away from the repair line is at a plane identical to an upper surface of the conductive layer away from the repair line.

Optionally, the protective layer covers the repair line and being in direct contact with a sidewall of the groove; the protective layer covers an upper surface of the insulation layer away from the repair line.

Optionally, an orthographic projection of the repair line onto the signal line is within an orthographic projection of the protective layer onto the signal line.

Optionally, the light-emitting layer is arranged at an upper surface of the protective layer away from the repair line.

A display panel is further provided in the present disclosure, including the above display substrate.

A display substrate repairing system is further provided in the present disclosure, including: a laser chemical vapor deposition repair device, configured to form, in the case that a signal line of the display substrate is detected to be open-circuited or short-circuited, a repair line at a disconnected portion of the signal line being open-circuited or a disconnected portion of the signal line formed during a short circuit repairing process; an ink-jet printing device, configured to form a protective layer at least in an area where the repair line is located.

DETAILED DESCRIPTION

The present disclosure will be described hereinafter in details in conjunction with embodiments and drawings.

Figure 1:
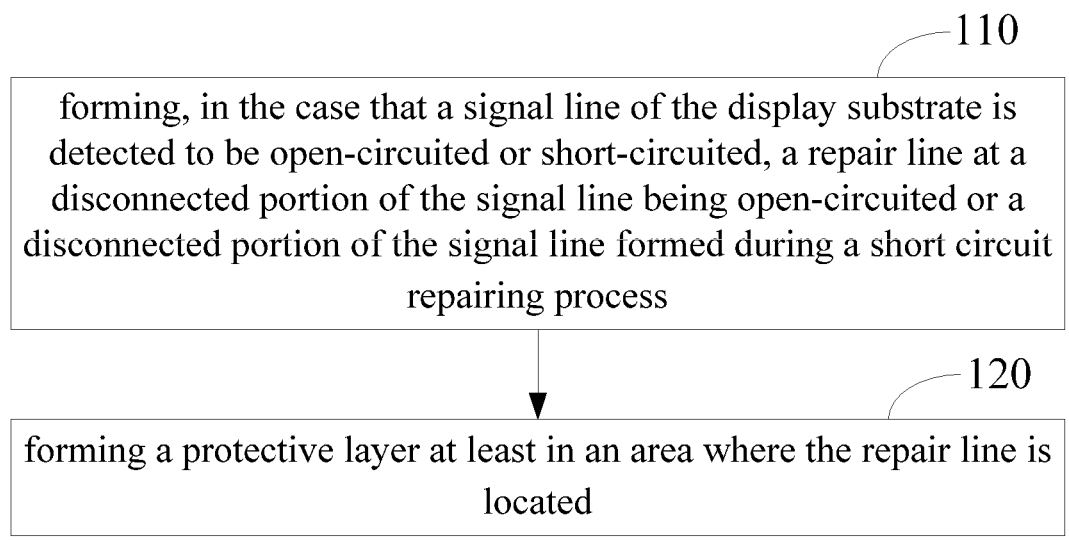
FIG. 1 is a flow chart of a display substrate repairing method in some embodiments of the present disclosure.

Referring to FIG. 1 which is a flow chart of a display substrate repairing method in some embodiments of the present disclosure, the method includes:

Step 110: forming, in the case that a signal line of the display substrate is detected to be open-circuited or short-circuited, a repair line at a disconnected portion of the signal line being open-circuited or a disconnected portion of the signal line formed during a short circuit repairing process;

Step 120: forming a protective layer at least in an area where the repair line is located.

According to some embodiments of the present disclosure, after forming the repair line at the disconnected portion of the signal line, the protective layer is then formed to protect the repair line, so the subsequent cleaning, coating, and other operations may not adversely affect the repair line and the repair line may not fall off, thereby improving the repair effect and the product quality.

In some embodiments of the present disclosure, the display substrate may be but not limited to a thin film transistor array substrate.

Optionally, in the above Step 110, the forming the repair line further includes: forming the repair line through a laser chemical vapor deposition process or an ink-jet printing process. Of course, the repair line may also be formed by other processes, and the detailed description thereof is omitted herein.

The repair line may be made of various materials such as tungsten powders and conductive silver glue. If the tungsten powders are used, the laser chemical vapor deposition repair technology may be applied, and if the conductive silver glue is used, the ink-jet printing technology may be applied.

Optionally, in the above Step 120, the forming the protective layer at least in the area where the repair line is located further includes: coating a material of the protective layer at least onto the area where the repair line is located, through an ink-jet printing process; curing the material of the protective layer, to form the protective layer. The curing process may be an ultraviolet curing process or a thermal curing process. Of course, the protective layer may also be formed by other processes, and the detailed description thereof is omitted herein.

According to some embodiments of the present disclosure, the repairing process may be performed when no other film layer structure is formed above the signal line, or performed when a certain film layer structure has been formed above the signal line. In addition, after the repairing process, the subsequent film structure may be further prepared.

Figure 2:
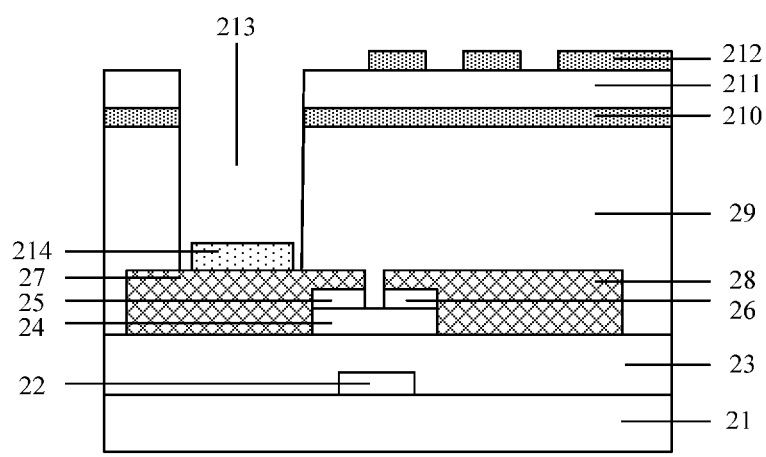
FIG. 2 is a schematic view of a repairing structure of a display substrate with an organic film layer structure in the related art.

The repairing process in the related art may bring other technical issues, for example:

Technical issue I: if there are other film layer structures on signal lines, such as an organic film layer structure, taking the display substrate shown in FIG. 2 as an example, the display substrate includes a base substrate 21, and a gate electrode 22 on the base substrate 21, a gate insulating layer 23 covering the gate electrode 22, an active layer 24 located on the gate insulating layer 23, and a first ohmic contact layer 25 and a second ohmic contact layer 26 oppositely disposed on the active layer 24, a source electrode signal line 27 on the ohmic contact layer 25 and the gate insulating layer 23, a drain electrode signal line 28 on the second ohmic contact layer 26 and the gate insulating layer 23, an organic film layer 29 covering the active layer 24, the source electrode signal line 27 and the drain of the polar signal line 28, a first electrode layer 210 on the organic film layer 29, an insulating layer 211 on the first electrode layer 210, and a second electrode layer 212 on the insulating layer 211. If the source electrode signal line 27 is open-circuited, the organic film layer 29, the first electrode layer 210, and the insulating layer 211 above the disconnected portion need to be removed to form a groove 213, and then a repair line 214 is formed at the disconnected position. After the repairing process, the organic film layer 29 is thick, and the groove lacks more layers of film relative to other areas, so the transparency may be relatively large, which may result in bright spots.

Technical issue II: after repairing the liquid crystal product, the repair line may affect the alignment of the liquid crystals and cause the formation of bright spots which are visible under any of R/G/B images.

Technical issue III: the repair line has overlapped areas with other conductive layers, resulting in an additional capacitive effect and causing bright spots.

Technical issue IV: after the source electrode signal line is disconnected, the line defect turns to a bright spot defect after the repairing process.

Technical issue V: if the laser chemical vapor deposition is used to form the repair line, the material will diffuse into the channel of the thin film transistor during the deposition process, resulting in a short circuit, which will also cause bright spots.

Technical issue VI: the failure of darkening may still cause a bright spot defect.

Technical issue VII: the signal line is electrically connected to other conductive film layers directly through the protective layer. Taking an OLED product as an example, referring to the OLED display substrate shown in FIG. 3. The display substrate includes a base substrate 31, a gate electrode 32 on the base substrate 31, a gate insulating layer 33 covering the gate 32, an active layer 34 located on the gate insulating layer 33, a first ohmic contact layer 35 and a second ohmic contact layer oppositely disposed on the active layer 34, a source electrode signal line 37 on the first ohmic contact layer 35 and the gate insulating layer 33, a drain electrode signal line 38 on the second ohmic contact layer 36 and the gate insulating layer 33, an insulating layer 39 covering the active layer 34, the source electrode signal line 37 and the drain electrode signal line 38, an organic film layer 310 on the insulating layer 39, and an anode layer 311 on the organic film layer 310. If the source electrode signal line 37 is disconnected, the insulating layer 39, the organic film layer 310, and the anode layer 311 above the disconnected portion need to be removed to form a groove 312, and then a repair line 313 is formed at the disconnected portion. After the repairing process, at the groove 312, the repair line 313 replaces the original anode layer 311. After the light emitting layer 314 and the cathode layer 315 are formed, the light emitting layer 314 is directly connected to the repair line 313 and the cathode layer 315, and the light emitting layer is turned on, without the control of the thin film transistor, it becomes a bright spot. Because the organic film layer 310 is thick, the step at the groove 312 is too large, and the light emitting layer 314 may be easily broken, and the cathode layer and the anode layer are directly short-circuited, resulting in the formation of a dark line.

In view of the above technical issues, the above Step 110 further includes: removing a film layer above the disconnected portion of the signal line to form a groove; forming the repair line in the groove. Correspondingly, the above Step 120 further includes: filling a material of the protective layer into the groove where the repair line is located, until the groove is full of the material of the protective layer. In some embodiments of the present disclosure, by filling the material of the protective layer into the groove where the repair line is located until the groove is full of the material of the protective layer, on one hand, for the above technical issue I, the protective layer filled in the groove replaces the removed film layer, and the transmittance is reduced and the repair line is darkened, thereby solving the bright spots defect caused by the grooves; on the other hand, for the above technical issue VII, since the groove is full of the material of the protective layer, the segment gap is eliminated, so that the subsequent film layer may become flat at the position corresponding to the groove and may not be broken, thereby solving the dark line caused by the large segment gap.

In some embodiments of the present disclosure, the protective layer is opaque. As such, the protective layer may further shield the bright spot defective area. Optionally, the above Step 120 further includes: forming the protective layer in a part of or an overall area of a pixel unit provided with the repair line. In an actual operation, whether to partially or completely shield the pixel is determined based on the cause of the bright spot defect of the pixel area. For example, for the above technical issues I, II, III, VII, the pixel unit area is partially shielded, and for the above technical issues IV, V, VI, the pixel unit area is completely shielded.

In some embodiments of the present disclosure, the protective layer is insulated, and the protective layer is made of an organic material. For example, the organic material is a polyimide or a phenolic resin, and may also be an acrylate, an unsaturated polyester, an epoxy acrylate, a urethane acrylate, a bisphenol A epoxy resin, an acrylate silicone, or an isocyanides-containing resin, an acid-based urethane acrylate or polyethylene glycol urethane acrylate, and so on. In some embodiments, the insulated protection layer may prevent the signal line from directly connecting to the other conductive film layer through the protection layer, thereby effectively solving the above technical issues where the light-emitting layer is not controlled by the thin film transistor in the OLED.

In addition, a display substrate is further provided in the present disclosure, including a plurality of signal lines. A signal line has a disconnected portion formed during an open circuit repairing process or a short circuit repairing process, a repair line is arranged at the disconnected portion of the signal line, and a protective layer is arranged at least in an area where the repair line is located.

Optionally, the signal line is a source electrode signal line, and the display substrate further includes an organic film layer, a conductive layer and an insulation layer stacked on the signal line. A groove penetrating through the organic film layer, the conductive layer and the insulation layer is arranged at the disconnected portion of the signal line. The repair line is arranged in the groove full of the protective layer being opaque. The protective layer also covers the groove and the area around the groove.

In some embodiments of the present disclosure, the display substrate has an organic film layer structure, after the source electrode signal line which has been open-circuited or short-circuited is repaired, the groove is full of the opaque protective layer, and the groove and the area around the groove are shielded by the opaque protective layer, so the occurrence of bright spots are avoided.

Optionally, the signal line is a source electrode signal line, and the display substrate further includes an organic film layer and an insulation layer stacked on the signal line; a groove penetrating through the organic film layer and the insulation layer is arranged at the disconnected portion of the signal line; the repair line is arranged in the groove full of the protective layer being opaque and insulated; the display substrate further includes a light-emitting layer and a cathode layer stacked on the protective layer and the organic film layer.

In some embodiments of the present disclosure, the display substrate has an OLED structure, after the source electrode signal line which has been open-circuited or short-circuited is repaired, the groove is full of the protective layer, so the segment gap may be eliminated, the light emitting layer may not be easily broken, and the light-emitting layer may not be directly turned on since the protective layer is insulated, so the occurrence of bright spots are avoided.

Figure 7:
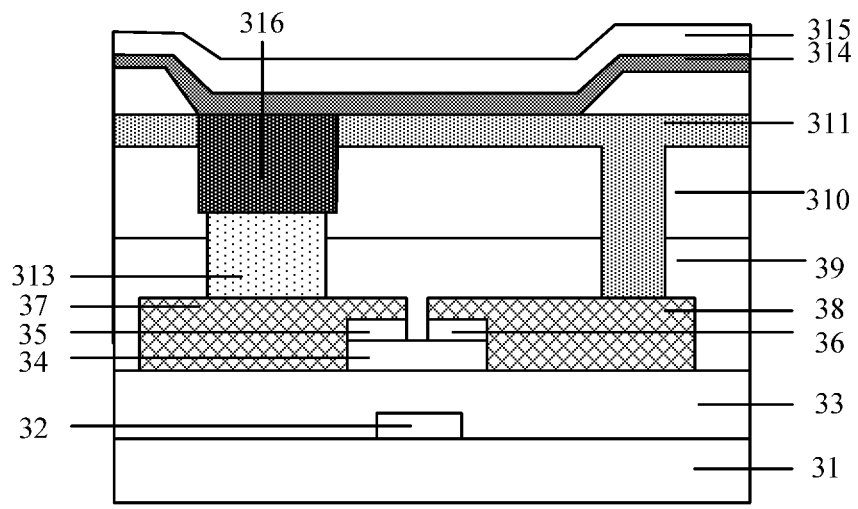
FIG. 7 is a schematic view of a repairing structure of an OLED display substrate in some embodiments of the present disclosure.

As shown in FIG. 7, in some embodiments of the present disclosure, the protective layer 316 covers the repair line 313 and being in direct contact with a sidewall of the groove 312. An upper surface of the protective layer 316 away from the repair line 313 is at a plane identical to an upper surface of the anode layer 311 away from the repair line 313.

Figure 4:
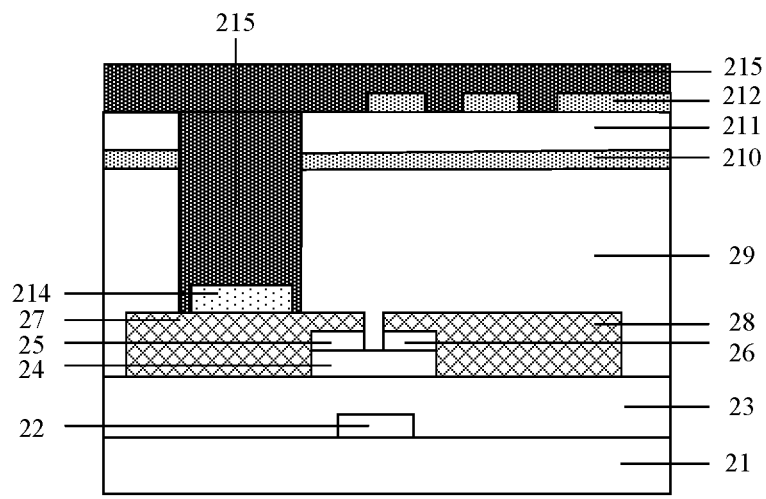
FIG. 4 is a schematic view of a repairing structure of a display substrate with an organic film layer structure in some embodiments of the present disclosure.

As shown in FIG. 4, in some embodiments of the present disclosure, the protective layer 215 covers the repair line 214 and being in direct contact with a sidewall of the groove. The protective layer 215 covers an upper surface of the insulation layer 211 away from the repair line 214.

As shown in FIG. 4, in some embodiments of the present disclosure, an orthographic projection of the repair line 214 onto the source electrode signal line 27 is within an orthographic projection of the protective layer 215 onto the source electrode signal line 27.

As shown in FIG. 7, in some embodiments of the present disclosure, an orthographic projection of the repair line 313 onto the source electrode signal line 37 is within an orthographic projection of the protective layer 316 onto the source electrode signal line 37.

Next, the display substrate repairing method and the display substrate will be described in details hereinafter.

Taking the display substrate has an organic film layer structure shown in FIG. 2 as an example, the display substrate repairing method is as follows.

In Step I, the insulating layer 211 is cut to form a processing outline of the organic film layer to prevent the organic film layer from being cracked. According to the processing outline, the insulating layer 211, the first conductive electrode layer 210, and the organic film layer 29 are removed. A groove 213 is formed at the disconnected portion of the source electrode signal line 27. Tungsten powders are deposited at the disconnected portion of the source electrode signal line 27 through a laser chemical vapor deposition repair process to form a repair line 214. The ITO (i.e., the first conductive electrode 210 and the second conductive electrode 212) in contact with the tungsten powders on the sidewall of the groove is removed, thereby preventing an occurrence of short circuit.

In Step II, as shown in FIG. 4, the opaque protective layer material is filled into the groove through an ink-jet printing process until the groove is full of the opaque protective layer material. Further, the protective layer material is coated above the groove and at the area around the groove. Then, the protective layer material is cured by ultraviolet rays, so as to form a protective layer 215.

Figure 3:
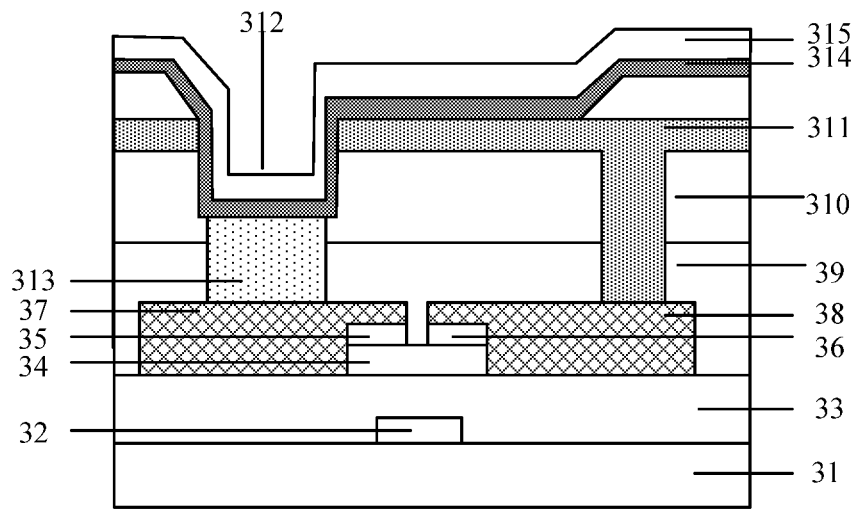
FIG. 3 is a schematic view of a repairing structure of an OLED display substrate in the related art.

Taking the display substrate has an OLED structure shown in FIG. 3 as an example, the display substrate repairing method is as follows.

Figure 5:
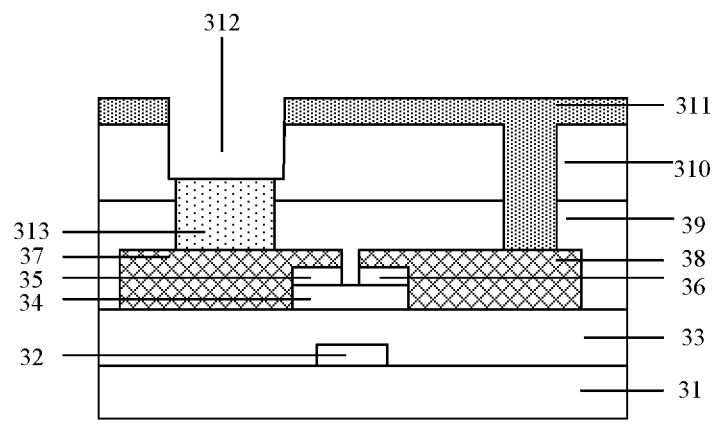
FIG. 5 is a schematic view of a repairing structure of a display substrate with an organic film layer structure in some embodiments of the present disclosure.

In Step I, the anode layer 311, the organic film layer 310, and the insulating layer 39 above the disconnected source electrode signal line 37 are removed to form a groove 312, and tungsten powders are deposited at the disconnected portion of the source electrode signal line 37 through a laser chemical vapor deposition process, so as to form the repair line 313. Then, the ITO in contact with the tungsten powders in the groove is removed to avoid an occurrence of short circuit, as shown in FIG. 5.

Figure 6:
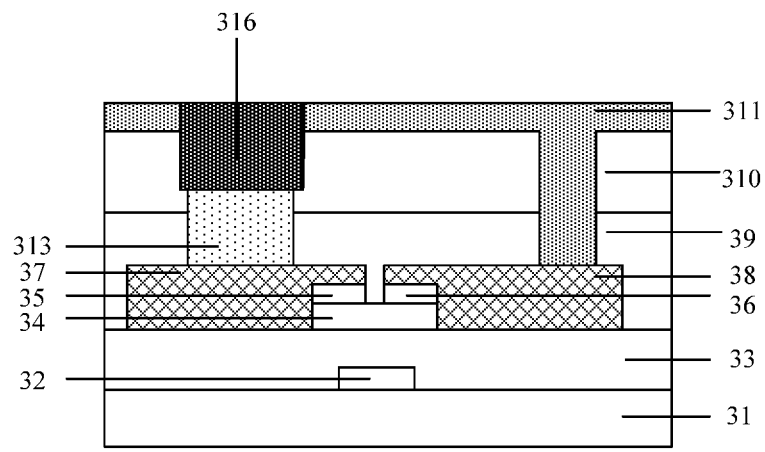
FIG. 6 is a schematic view of a repairing structure of an OLED display substrate in some embodiments of the present disclosure.

In Step II, the opaque and insulated protective layer material is filled into the groove 312 thought an ink-jet printing process until the groove 312 is full of the opaque and insulated protective layer material. Then, the protective layer material is cured by ultraviolet rays, so as to form a protective layer 316, as shown in FIG. 6.

In the repaired display substrate, the groove 312 is full of the insulated and opaque protective layer 316, after the light-emitting layer 314 is formed by evaporation and the cathode layer 315 is formed, the light-emitting layer 314 may not be broken at the groove, and the cathode layer 315 and the source signal lines may not be short-circuited, thereby avoiding an occurrence of a dark line.

Furthermore, a display substrate repairing system is further provided in the present disclosure, including: a laser chemical vapor deposition repair device, configured to form, in the case that a signal line of the display substrate is detected to be open-circuited or short-circuited, a repair line at a disconnected portion of the signal line being open-circuited or a disconnected portion of the signal line formed during a short circuit repairing process; an ink-jet printing device, configured to form a protective layer at least in an area where the repair line is located.

According to the display substrate repairing method, the display substrate repairing system, the display substrate and the display panel, after forming the repair line at the disconnected portion of the signal line, the protective layer is then formed to protect the repair line, so the subsequent cleaning, coating, and other operations may not adversely affect the repair line and the repair line may not fall off, thereby improving the repair effect and the product quality.

The above descriptions of the embodiments are merely intended to facilitate understanding of the methods and the core thought thereof. It should be noted that, a person skilled in the art may make improvements and modifications without departing from the principle of the present disclosure, and these improvements and modifications shall also fall within the scope of the present disclosure.

What is claimed is:

1. A display substrate, comprising a signal line having a disconnected portion formed during an open circuit repairing process or a short circuit repairing process, wherein a repair line is arranged at the disconnected portion of the signal line, and a protective layer is arranged at least in an area where the repair line is located;
    wherein the signal line is a source electrode signal line, and the display substrate further comprises an organic film layer, a conductive layer and an insulation layer stacked on the signal line;
    a groove penetrating through the organic film layer, the conductive layer and the insulation layer is arranged at the disconnected portion of the signal line;
    the repair line is arranged in the groove full of the protective layer, the protective layer being opaque.

2. The display substrate according to claim 1, wherein the protective layer covers the repair line and is in direct contact with a sidewall of the groove;
    an upper surface of the protective layer away from the repair line is at a plane identical to an upper surface of the conductive layer away from the repair line.

3. The display substrate according to claim 1, wherein the protective layer covers the repair line and is in direct contact with a sidewall of the groove;
    the protective layer covers an upper surface of the insulation layer away from the repair line.

4. The display substrate according to claim 1, wherein an orthographic projection of the repair line onto the signal line is within an orthographic projection of the protective layer onto the signal line.

5. A display panel, comprising the display substrate according to claim 1.

6. A display substrate repairing system, applied to repair the display substrate according to claim 1, comprising:
    a laser chemical vapor deposition repair device, configured to form, in the case that a signal line of the display substrate is detected to be open-circuited or short-circuited, a repair line at a disconnected portion of the signal line being open-circuited or a disconnected portion of the signal line formed during a short circuit repairing process;
    an ink-jet printing device, configured to form a protective layer at least in an area where the repair line is located.

7. A display substrate, comprising a signal line having a disconnected portion formed during an open circuit repairing process or a short circuit repairing process, wherein a repair line is arranged at the disconnected portion of the signal line, and a protective layer is arranged at least in an area where the repair line is located;

wherein the signal line is a source electrode signal line, and the display substrate further comprises an organic film layer and an insulation layer stacked on the signal line;

a groove penetrating through the organic film layer and the insulation layer is arranged at the disconnected portion of the signal line;

the repair line is arranged in the groove full of the protective layer, the protective layer being opaque and insulated;

the display substrate further comprises a light-emitting layer and a cathode layer stacked on the protective layer and the organic film layer.

8. The display substrate according to claim 7, wherein the light-emitting layer is arranged at an upper surface of the protective layer away from the repair line.

9. A display substrate repairing method, applied to repair the display substrate according to claim 7, comprising:

forming, in the case that a signal line of the display substrate is detected to be open-circuited or short-circuited, a repair line at a disconnected portion of the signal line being open-circuited or a disconnected portion of the signal line formed during a short circuit repairing process;

forming a protective layer at least in an area where the repair line is located;

wherein the forming, in the case that the signal line of the display substrate is detected to be open-circuited or short-circuited, the repair line at the disconnected portion of the signal line being open-circuited or the disconnected portion of the signal line formed during the short circuit repairing process, further comprises:

removing a film layer above the disconnected portion of the signal line to form a groove;

forming the repair line in the groove;

wherein the forming the protective layer at least in the area where the repair line is located further comprises:

filling a material of the protective layer into the groove where the repair line is located, until the groove is full of the material of the protective layer;

wherein the protective layer is opaque.

10. A display substrate repairing system, applied to repair the display substrate according to claim 7, comprising:

a laser chemical vapor deposition repair device, configured to form, in the case that a signal line of the display substrate is detected to be open-circuited or short-circuited, a repair line at a disconnected portion of the signal line being open-circuited or a disconnected portion of the signal line formed during a short circuit repairing process;

an ink-jet printing device, configured to form a protective layer at least in an area where the repair line is located.

* * * * *